United States Patent [19]

Hirano et al.

[11] Patent Number: 5,484,326
[45] Date of Patent: Jan. 16, 1996

[54] SEMICONDUCTOR INGOT MACHINING METHOD

[75] Inventors: Yoshihiro Hirano; Atsushi Ozaki, both of Annaka, Japan

[73] Assignee: Shin-Etsu Handotai Company, Ltd., Tokyo, Japan

[21] Appl. No.: 159,501

[22] Filed: Nov. 30, 1993

[30] Foreign Application Priority Data

Nov. 30, 1992  [JP]  Japan ..................... 4-320533

[51] Int. Cl.⁶ ..................... B24B 1/00; B24B 7/00
[52] U.S. Cl. ..................... 451/41; 451/67; 451/69; 451/57; 451/54; 125/13.02
[58] Field of Search ..................... 51/5 R, 5 B, 5 C, 51/281 R, 281 SF, 283 R, 283 E, 326, 327, 323; 451/67, 69, 70, 28, 63, 41, 44, 57, 58, 54; 125/10, 13.02

[56] References Cited

U.S. PATENT DOCUMENTS

| | | | |
|---|---|---|---|
| 4,084,354 | 4/1978 | Grandia et al. | 51/283 R |
| 4,756,796 | 7/1988 | Saitou | 51/283 R |
| 4,773,951 | 9/1988 | Moffatt et al. | 51/283 R |
| 4,894,956 | 1/1990 | Honda et al. | 51/323 |
| 4,896,459 | 1/1990 | Brandt | 51/5 C |
| 5,111,622 | 5/1992 | Steere, Jr. | 51/5 C |
| 5,185,956 | 2/1993 | Steere, Jr. | 51/5 C |
| 5,329,733 | 7/1994 | Steere, Jr. | 51/283 R |

Primary Examiner—Bruce M. Kisliuk
Assistant Examiner—Eileen P. Morgan
Attorney, Agent, or Firm—Browdy and Neimark

[57] ABSTRACT

The cutting process is executed after the grinding process and for one semiconductor ingot, one grinding device and one inner diameter saw slicing machine are used to perform grinding process and cutting process respectively. During the grinding process, the entirety of the cylindrical body portion of the semiconductor ingot is cylindrically ground, a portion of the tail end is cylindrically ground, the orientation flat position is determined and an orientation flat is formed by surface grinding. During the cutting process the tail portion is cut off and a sample for lifetime measurement is taken and a wafer sample is cut off from the end of the cylindrical body portion on the tail side. The semiconductor ingot is reversed in the direction of the axis and the head portion of the semiconductor ingot is cut off and a wafer sample is cut off from the cylindrical body portion on the head side. Wafer samples are cut off from the end of the cylindrical body portion on the head side and from the middle portion of cylindrical body portion to divide the cylindrical body portion into two blocks.

2 Claims, 7 Drawing Sheets

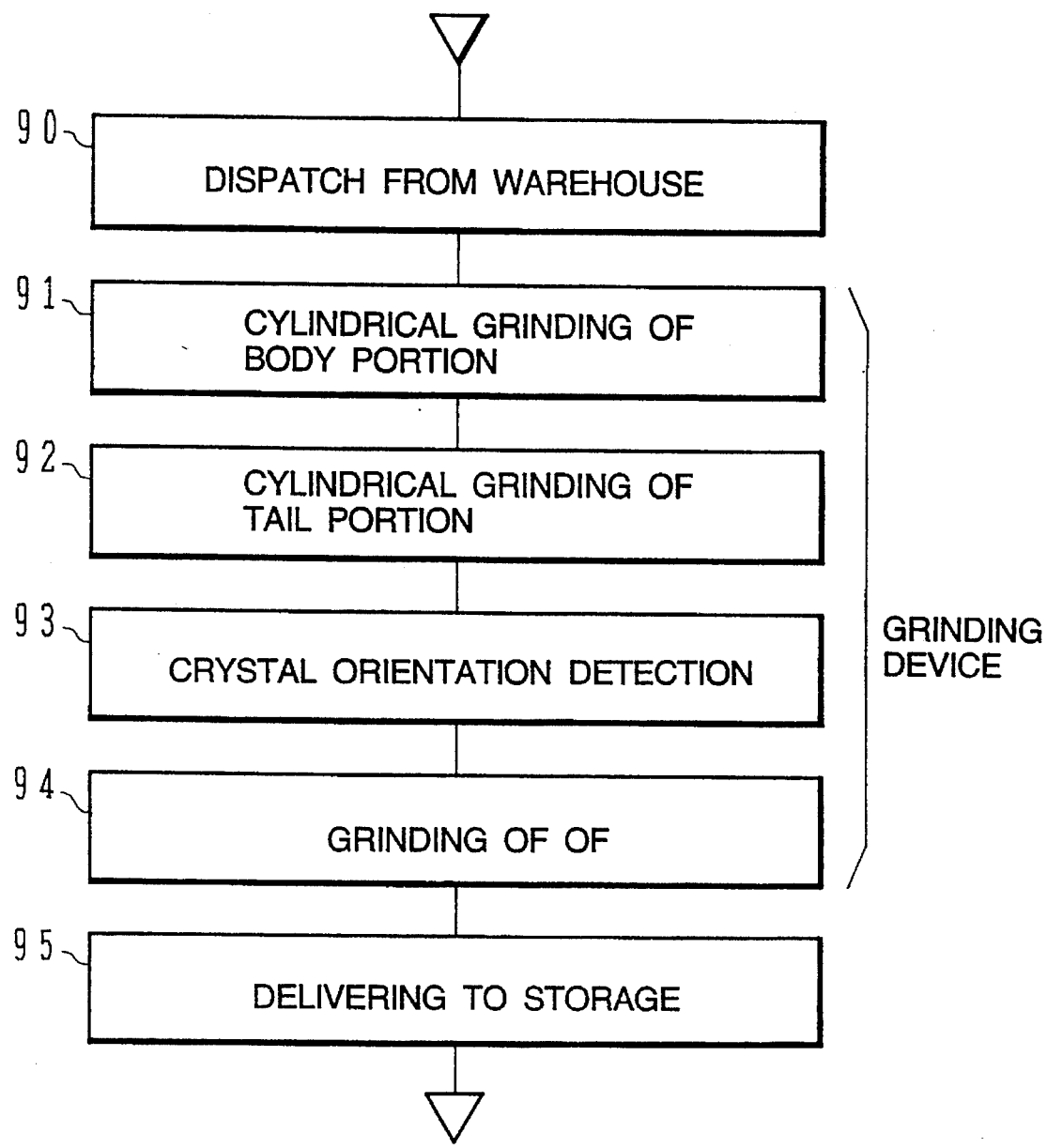

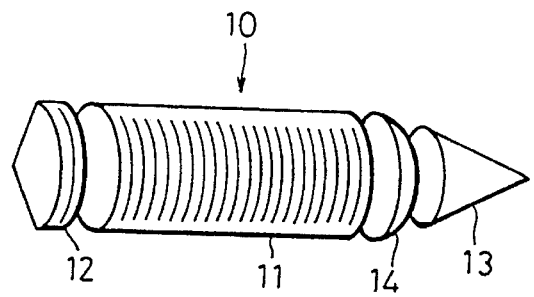
FIG. 7(A) PRIOR ART
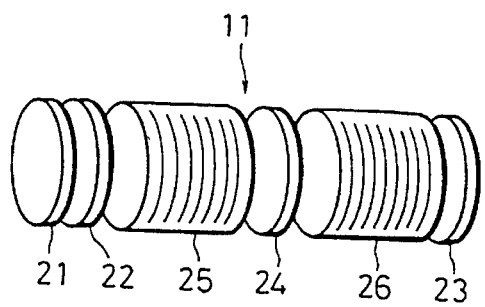
FIG. 7(B) PRIOR ART
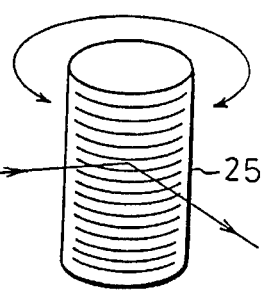
FIG. 7(C) PRIOR ART
FIG. 7(D) PRIOR ART
FIG. 7(E) PRIOR ART

SEMICONDUCTOR INGOT MACHINING METHOD

BACKGROUND OF THE INVENTION

1. Field of the Invention

The present invention relates to a semiconductor ingot machining method.

2. Description of the Prior Art

FIG. 7(A)–(D) shows the prior art grinding and cutting method for semiconductor ingots 10.

FIG. 7(A) First, the semiconductor ingot 10 is mounted in an outer diameter saw slicing machine with a blade thickness of approximately 2500 μm. The two ends, i.e. the head portion 12 and the tail portion 13 are separated from the cylindrical body portion 11 of the semiconductor ingot 10 and a sample 14 is cut off for lifetime measurement from the tail portion 13 end.

FIG. 7(B) Next, the cylindrical body portion 11 is mounted in an inner diameter saw slicing machine with a blade thickness of approximately 400 μm and wafer samples 21, 22, 23 and 24 are cut off from both ends and the middle section of the cylindrical body portion 11 for crystal property inspection. With this, the block 25 is formed between the wafer samples 22 and 24, and the block 26 is formed between the wafer samples 23 and 24.

FIG. 7(C) The block 25 is mounted in a grinding device equipped with an azimuth reference positioning device that irradiates the block 25 with x-rays while rotating it around its axis to determine the azimuth reference position based upon the peak intensity of the diffracted rays.

FIG. 7(D) A grindstone is pressed down on the circumference surface of the block 25 while it is being rotated. The block 25A is obtained by cylindrically grinding the block 25 by moving the grindstone parallel to the axis of rotation of the block 25.

FIG. 7(E) The block 25B is fixed at an appropriate angular position in relation to the grinding device and by moving the grindstone and grinding the block 25B parallel to the axis of the block 25B, an orientation flat OF or a notch not shown is formed at the azimuth reference position which has been determined during the above step C.

The steps in FIGS. 7(C) to 7(D) above are performed similarly for the block 26.

Since each of the blocks 25 and 26 must be aligned and mounted in the grinding device, the azimuth reference position must be determined, and cylindrical grinding and surface grinding or notch grinding must be performed for each block, the entire process becomes complex. Therefore, full automation and systematization of such a procedure involves complicated equipment and facilities. Also, as cutting must be performed by placing the blade on the inclined faces at both ends of the semiconductor ingot 10 in the step in FIG. 7(A), it is not possible to use an inner diameter saw slicing machine with its higher cutting speed and thinner blade for if used, damage to the blade is likely to occur at the time of cutting, greatly reducing the life of the blade. As a result, different cutting devices must be used for the step in FIG. 7(A) and the step in FIG. 7(B). Also, since the ingot must be aligned for mounting each time, the whole process becomes even more complex and makes automation of the system even more complicated.

SUMMARY OF THE INVENTION

Accordingly, an object of the present invention is to provide a semiconductor ingot machining method in which the grinding process and the cutting process for semiconductor ingots can be simplified and in which it is possible to simplify the system of automating the grinding process and the cutting process.

The semiconductor ingot machining method according to the present invention is explained by quoting the component key numbers that correspond with the numbers used in the figures illustrating the embodiment.

The present invention is a semiconductor ingot machining method in which a grown but unprocessed semiconductor ingot 10 (FIG. 3) is ground and cut. The cutting process is executed after the grinding process and the grinding process is executed with one grinding device for each one semiconductor ingot and the grinding process consists of the following steps, executed in the stated order as, for example, shown in FIGS. 1 and 2:

(91) An unprocessed semiconductor ingot is mounted in the grinding device and the circumference S of the cylindrical body portion of the semiconductor ingot is cylindrically ground while the semiconductor ingot is being rotated around the axis, FIG. 1(A)

(93) The semiconductor ingot 30A or 30B that has been mounted in the grinding device is irradiated with x-rays while it is being rotated around the axis to detect its diffracted x-ray and to consequently determine the azimuth reference position based upon the peak detected value (FIG. 1(C)).

(94) The rotation of the semiconductor ingot 30A or 30B mounted in the grinding device is stopped and the semiconductor ingot 30A or 30B is ground parallel to its axis at the determined azimuth reference position to form an orientation flat OF or a notch not shown (FIG. 1(D)).

According to the present invention, the cylindrical grinding on the entirety of the cylindrical body portion of the semiconductor ingot 10 is performed, the azimuth reference position is determined and an orientation flat OF or a notch is formed at that reference position before cutting. Each semiconductor ingot 10 is mounted into and dismounted from the grinding device and aligned only once. Also, cylindrical grinding, azimuth reference positioning and surface grinding or notch grinding need only be performed once for each. The result is a simplified grinding process and a simplified system of automation.

Also, as shown in FIG. 3, in the prior art technology, the cone-shaped ends 32 and 33 were removed along a two-point chain line before cylindrical grinding. However, if the cylindrical grinding is performed on the semiconductor ingot 10 before both ends of the cylindrical body portion 31 are removed, the usable portion of both ends of the cylindrical body portion 31 can be extended by Δt.

According to the first aspect of the present invention, the aforementioned cutting process is executed with one inner diameter saw slicing machine for each semiconductor ingot 30D ground as described above. This cutting process consists of steps, for example, that are executed in the following order, as shown in FIGS. 4(A)–(E) and 5.

(101) The inner diameter blade of the inner diameter saw slicing machine is placed perpendicular to the cylindrically ground circumference surface of the semiconductor ingot 30D to cut off one of the cone-shaped ends 33b (FIG. 4A) of the semiconductor ingot 30D.

(102) Wafer sample 34 is cut off from the end of the semiconductor ingot cylindrical body portion 31B where the cutting above was performed (FIG. 4(B)).

(103) The semiconductor ingot 30C is reversed in the direction of its axis (FIG. 4(C)).

(104) The inner diameter blade of the inner diameter saw slicing machine is placed perpendicular to the cylindrically ground circumference surface of the semiconductor ingot 30C to cut off the other cone-shaped end 32 of the semiconductor ingot 30C (FIG. 4(D)).

(105) A wafer sample 41 is cut off from the other cut end of the semiconductor ingot cylindrical body portion 31D (FIG. 4(E)).

(105) A wafer sample 43 is cut off from the cylindrical body portion 31D of the semiconductor ingot to divide the semiconductor ingot cylindrical body portion 31D into a plurality of blocks, for example, two blocks 42 and 44 (FIG. 4(E)).

According to the present invention, since cutting is performed after cylindrical grinding, cutting can be performed by placing the blade perpendicular to the work surface as described in the first aspect of the present invention. Therefore, cutting can be done with an inner diameter saw slicing machine only, thereby simplifying the cutting process and the system of automation. Also, as cutting is performed after grinding, the blade can be placed perpendicular to the work surface to prevent an asymmetrical force being applied to the blade, thereby extending the life of the blade.

According to the third aspect of the present invention, cutting off a sample for lifetime measurement entails the following steps:

(92) a step of forming a smaller diameter portion (FIG. 1(B)) by cylindrically grinding the circumference of one of the cone-shaped ends 33 of the semiconductor ingot 30A over a distance from the end of the semiconductor ingot cylindrical body portion 31 that is being ground while rotating the semiconductor ingot 30A mounted in the aforementioned grinding device around its axis. This step is executed between the aforementioned cylindrical grinding step 91 and the azimuth reference positioning step 93.

(101) a step of cutting off a portion 33c (FIG. 4(A)) including both different diameters of the semiconductor ingot as a sample for measuring the lifetime. This step is executed between the aforementioned step 101 in which one of the cone-shaped ends is cut off and the aforementioned wafer sample removal step 102.

The advantages of the present invention as described above can be achieved when these processes are combined.

BRIEF DESCRIPTION OF THE DRAWINGS

FIG. 2 is a flow chart of the grinding process;

FIGS. 7(A)–(E) show a process diagram illustrating the grinding and cutting processes in the prior art.

DESCRIPTION OF THE PREFERRED EMBODIMENT

The following is a description of an embodiment of the present invention in reference to the figures.

First, the processing steps illustrated in FIG. 1(A) to 1(D) are performed with one grinding device for one semiconductor ingot and then the processing steps as indicated in FIG. 4(A) to 4(E) are performed in the given order with one inner diameter saw slicing machine.

Figure 6:
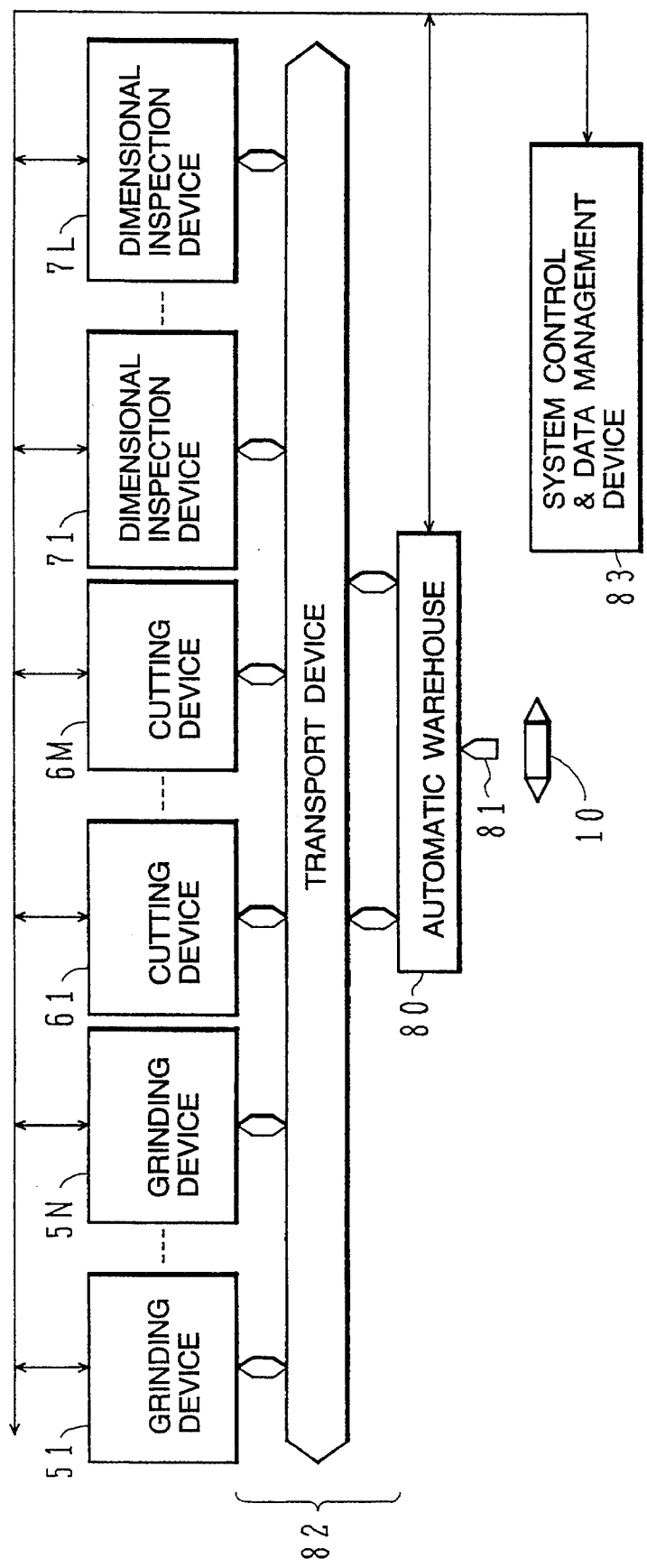
FIG. 6 is a block diagram illustrating an automated system for grinding and cutting semiconductor ingots.

These processing steps are executed in a fully automated system as illustrated in FIG. 6. This system is equipped with N grinding devices; 51–5N, M cutting devices; 61–6M, L dimensional inspection devices; 71–7L and an automatic warehouse 80, a transport device 81 for delivering formed semiconductor ingots 10 to the automatic warehouse 80, and the transport device 82 for transporting the semiconductor ingots between the grinding devices 51–5N, the cutting devices 61–6M, the dimensional inspection devices 71–7L and the automatic warehouse 80. The operational details of each device are controlled by a local controller, not shown in the figures, provided in each device. The control and data management for the entire system are performed by the system control & data management device 83.

In order to simplify overall control for efficient functioning, the following expedients are employed:

(1) Between the automatic warehouse 80 and the system control & data management device 83, only data exchange is performed; selection of semiconductor ingots to be sent out to meet requests is made at the automatic warehouse 80. The automatic warehouse 80 performs first-in, first-out FIFO processing of requests for receiving and dispatching ingots.

(2) Control of the grinding devices 51–5N and the automatic warehouse 80 is implemented as shown in FIG. 2.

Figure 5:
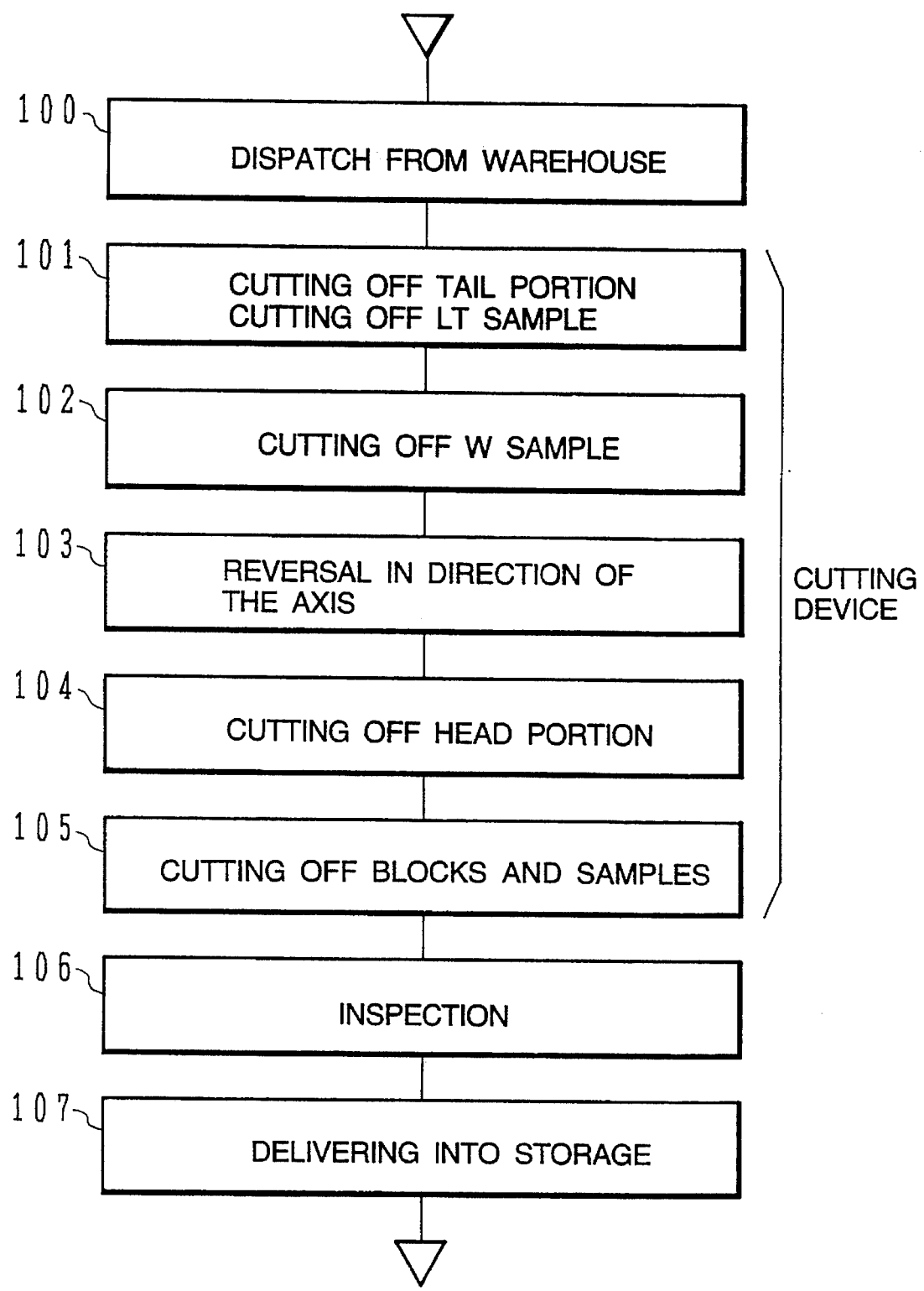
FIG. 5 is a flow chart of the cutting process.

(3) Control of the cutting devices 61–6M, the dimensional inspection devices 71–7L and the automatic warehouse 80 is performed as shown in FIG. 5, independent of the control system shown in FIG. 2.

Figure 3:
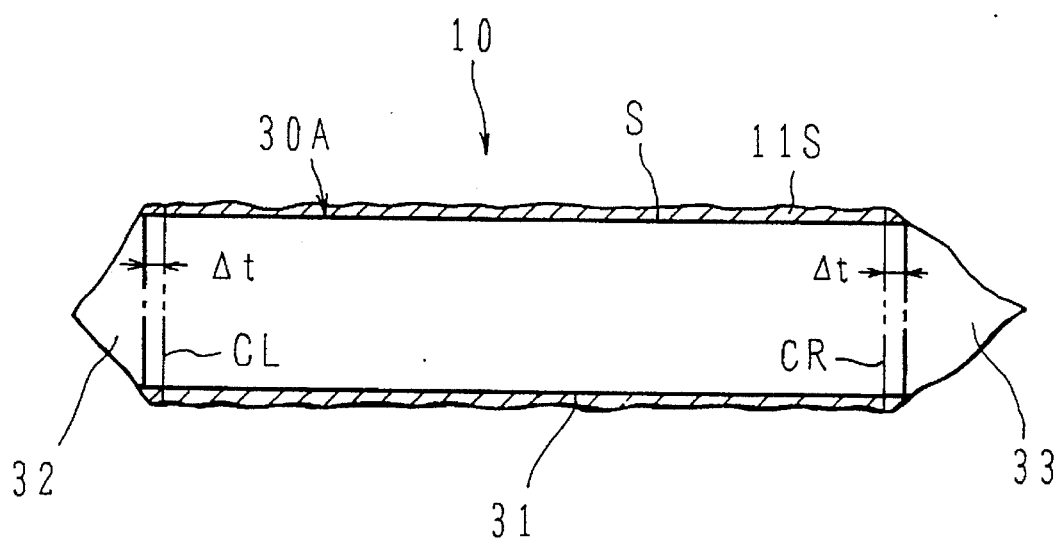
FIG. 3 is a diagram illustrating one of the advantages of performing cylindrical grinding before cutting.

Next, the processing steps shown in FIG. 2 are explained in reference to FIGS. 1, 3 and 6. Hereafter, the numerals in parenthesis indicate the step identification numbers used in the FIGS. FIG. 1(A) to 1(D) correspond with steps 91–94 in FIG. 2 respectively.

(90) The grinding devices 51–5N issue requests for unprocessed semiconductor ingots 10 to the automatic warehouse 80 independently of one another. The automatic warehouse 80, in response to these requests, dispatches the semiconductor ingots 10. The transport device 82 delivers a semiconductor ingot 10 to the requesting grinding device 5i (i=1 to N) and hands it over.

Figure 1A:
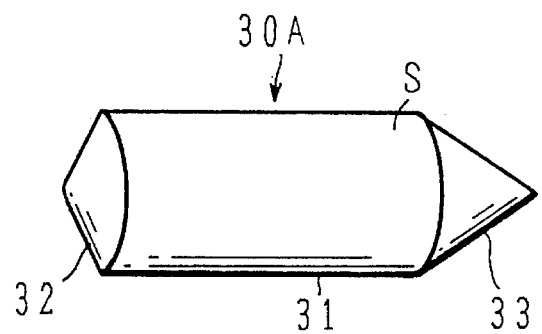
FIGS. 1(A)–(D) show a process diagram of the grinding steps in an embodiment of the present invention.

(91) The grinding device 5i aligns and mounts the semiconductor ingot 10, rotates it around its axis and cylindrically grinds the circumference of the cylindrical body portion by pressing the grindstone down onto it and moving it parallel to the axis of the semiconductor ingot 10. With this, the semiconductor ingot 30A as illustrated in FIG. 1(A) is obtained. The semiconductor ingot 30A comprises a cylindrical body portion 31, a cone-shaped head portion 32 and a cone-shaped tail portion 33 at both ends. Then a setting value for the diameter of the cylindrical body portion 31 is output by the system control & data management device 83 based on the measured data of the diameter that were obtained before delivery to the automatic warehouse 80. Further, alignment is performed with a 4-point support type aligning and loading device not shown in the FIGS. as in the prior art.

As shown in FIG. 3, the semiconductor ingot 30A is actually the semiconductor ingot 10 with the circumference portion 11S ground off to form the cylindrical body portion 31. In the prior art technology, as mentioned earlier, the head portion 32 and the tail portion 33 are cut off along the two point chain line before cylindrical grinding. However, if cylindrical grinding for the semiconductor ingot 10 is performed first, as it is in this embodiment, an advantage is obtained that the usable portion of both ends of the cylindrical body portion 31 can be extended by Δt.

Figure 1B:
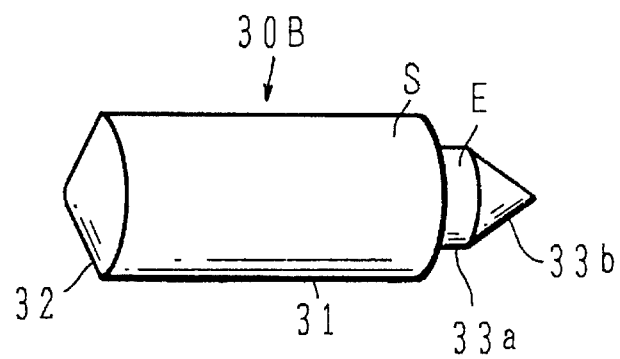
Figure 1C:
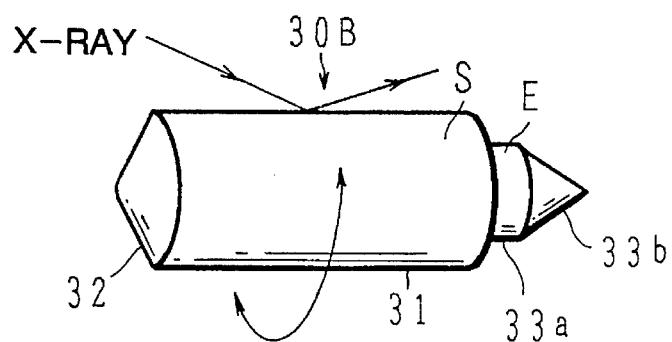
Figure 1D:
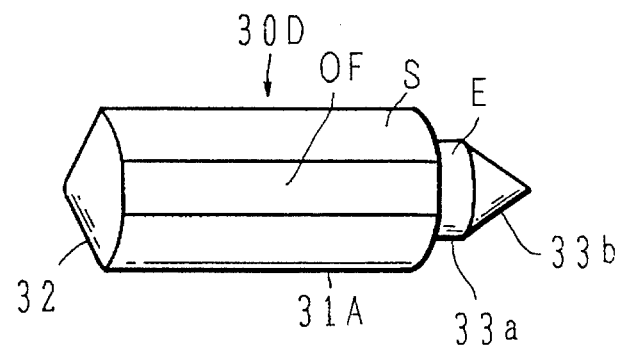

(92) In order to acquire a sample for lifetime measurement and to set the cut surface of the tail portion 33 at a right angle to the inner diameter blade, the circumference on the side of the cylindrical body portion 31 of the tail portion 33 is cylindrically ground over a length of, for example, 10 mm, to form the smaller-diameter section 33a as shown in FIG. 1(A) and 1(B). This processing step is executed only at a request from the system control & data management device 83.

(93) In order to determine the azimuth reference position, the grinding device 5i is equipped with an x-ray radiation device that can irradiate the cylindrical body portion 31 with x-rays at an arbitrary entry angle and a detector that detects the diffracted rays. The grinding device 5i irradiates the outer circumference surface S of the cylindrical body portion 31 with x-rays at a specific entry angle while the semiconductor ingot 30B is rotated around its axis, and it determines the azimuth reference position based upon the rotating position of the semiconductor ingot 30C when it identifies the position of peak intensity of the diffracted rays.

(94) The rotation of the semiconductor ingot 30C is stopped at an appropriate angular position and the grindstone is pressed down onto the semiconductor ingot 30C at the determined azimuth reference position and by grinding the semiconductor ingot 30C by moving the grindstone parallel to the axis of the semiconductor ingot 30C, an orientation flat OF as shown in FIG. 1 (D) or a notch not shown is formed. The setting value for the width of the orientation flat OF or the depth of the notch is received as an instruction from the system control & data management device 83.

(95) The semiconductor ingot 30D that has been thus ground is now detached from the grinding device 5i and handed over to the transport device 82. The transport device 82 delivers it to the automatic warehouse 80. On receiving it, the automatic warehouse 80 stores it as a product with grinding processing completed.

In this embodiment, cylindrical grinding on the entirety of the cylindrical body portion of the semiconductor ingot 10 is performed, the azimuth reference position is determined and an orientation flat OF or notch is formed by grinding at the reference position before cutting. As a result, for each semiconductor ingot 10, mounting into and dismounting from the grinding device and alignment is required only once. In addition, cylindrical grinding, azimuth reference position determining and surface or notch grinding are required only once each. Therefore, the number of steps performed by the grinding devices 51–5N is halved compared to the prior art system. The result is a simplified grinding process and a simplified system of automation.

Next, the processing steps shown in FIG. 5 are explained in reference to FIGS. 4 and 6. FIG. 4(A) to 4(E) correspond with steps 101 to 105 in FIG. 5 respectively.

(100) The cutting devices 61–6M issue requests to the automatic warehouse 80 for semiconductor ingots 30D that have been ground as described above, independently of one another. The automatic warehouse 80, in response to these requests, dispatches the semiconductor ingots 30D. The transport device 82, delivers the semiconductor ingot 30D to the requesting cutting device 6i (i=1 to M) and hands it over.

Figure 4A:
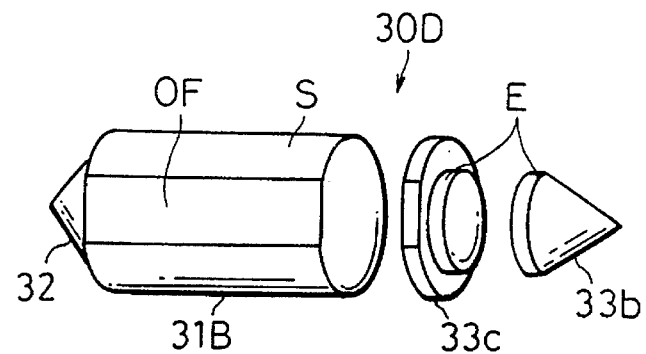
FIGS. 4(A)–(E) show a process diagram of the cutting steps in an embodiment of the present invention.

(101) The cutting device 6i secures the semiconductor ingot 30D and cuts off the tail portion 33b as shown in FIG. 4(A). Then it cuts off a sample 33c for lifetime measurement. The tail portion 33b is cut to the outer circumference surface E. With this, it becomes possible to cut off the tail portion 33b with an inner diameter saw slicing machine.

Figure 4B:
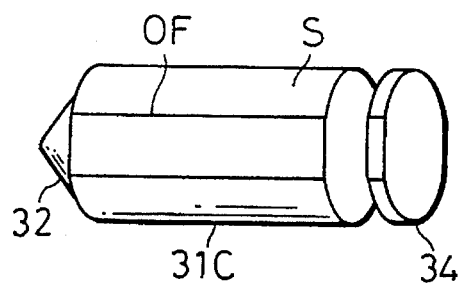

(102) A wafer sample 34 is cut off from the cylindrical body portion 31B as illustrated in FIG. 4(A) and 4(B). The wafer sample 34 is then transported and stored in a wafer cassette not shown in the figures. The number 31C indicates the excess material left over after wafer sample 34 is cut off from the cylindrical body portion 31B.

Figure 4C:
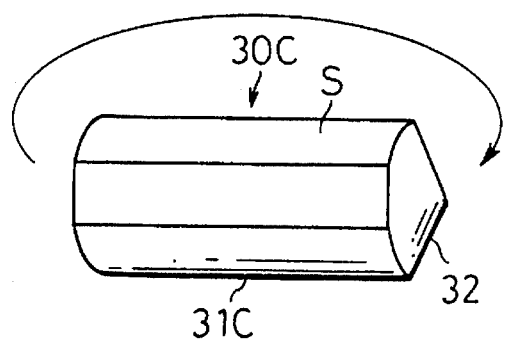

(103) The semiconductor ingot 30C is reversed in the direction of the axis as shown in FIG. 4(C). This reversing procedure is for transporting the cut items to be further explained later in the same direction.

Figure 4D:
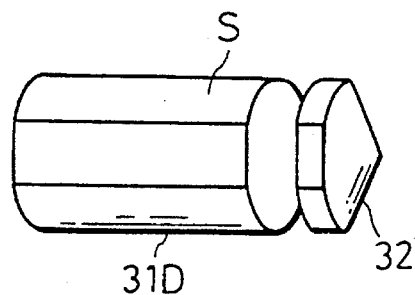

(104) Next, as shown in FIG. 4(D), the head portion 32 of the semiconductor ingot 30C is cut off to obtain the cylindrical body portion 31D. This cutting operation is performed into the outer circumference surface S of the cylindrical body portion 31C as shown in FIG. 4(C). With this, it becomes possible to cut off the head portion 32 with an inner diameter saw slicing machine.

Figure 4E:
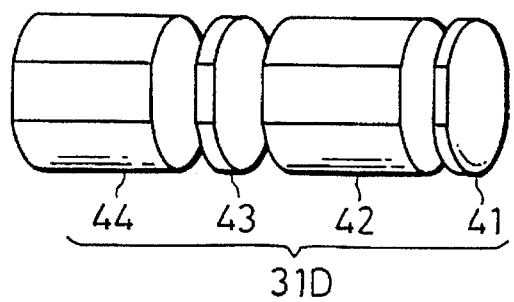

(105) As shown in FIG. 4(E), a wafer sample 41 is cut from the end of the cylindrical body portion 31D on the side of the head portion. Then, from the middle portion of the cylindrical body portion 31D a wafer sample 43 is cut out to obtain blocks 42 and 44. The wafer samples 41 and 43 are stored in the aforementioned wafer cassette and the blocks 42 and 44 are delivered to the dimensional inspection device 7j (j=1 to L) which has issued the request or which is the least backed-up, by the transport device 82. The cutting position of the wafer sample 43 is output by the system control & data management device 83.

(106) The dimensional inspection device 7j receives the blocks 42 and 44 and measures their length and diameter as well as the width of the orientation flat OF or the depth of the notch and sends these data to the system control & data management device 83. The wafer samples 41 and 43 along with the aforementioned wafer sample 34 are inspected for their crystal properties by a device not shown in the figures.

(107) After the dimensional inspection ,the blocks 42 and 44 are delivered to the automatic warehouse 80 by the transport device 82, and the automatic warehouse 80 receives and stores them.

In this embodiment, cutting can be done with an inner diameter saw slicing machine only, thus simplifying the cutting process and the system of automation. Also, as cutting is performed after grinding, the blade can be placed perpendicular to the work surface of the semiconductor ingot to prevent an asymmetrical force from being applied to the blade, thus extending the life of the blade.

Having described specific embodiment of the present invention, it is to be understood that modification and variation of the invention are possible without departing from the spirit and scope thereof.

What is claimed is:

1. A semiconductor ingot machining method for grinding and cutting grown but unprocessed semiconductor ingots (10) said cutting being executed after said grinding, said grinding being executed with one grinding device for each one of said semiconductor ingots, said grinding comprising the following sequential steps of:

selecting a semiconductor ingot;

mounting said unprocessed semiconductor ingot in said grinding device and cylindrically grinding said semiconductor ingot (S) while rotating said semiconductor ingot around an axis (91) to form a cylindrical body portion having a circumferential surface;

irradiating with x-rays said semiconductor ingot (30A, 30B) mounted in said grinding device while rotating said semiconductor ingot around the axis, detecting diffraction of said x-rays and determining an azimuth reference position based upon a peak detected value of said x-rays (93); and stopping rotation of said semiconductor ingot mounted in said grinding device and grinding said semiconductor ingot parallel to the axis at said azimuth reference position so as to form selectively an orientation flat (OF) and a notch;

for each one of said ground semiconductor ingots (30D), said cutting being executed with one inner diameter saw slicing machine, said cutting comprising the following sequential steps of:

cutting off a first of two cone-shaped ends (33b) of said semiconductor ingot by placing an inner diameter blade of said inner diameter saw slicing machine perpendicular to said circumference surface of said semiconductor ingot which has been cylindrically ground (101);

cutting off a first wafer sample (34) from a first cut side of said cylindrical body portion (31B) of said semiconductor ingot (102);

reversing an axis direction of said semiconductor ingot (103);

cutting off a second of the two cone-shaped end (32) of said semiconductor ingot by placing said inner diameter blade perpendicular to the circumferential surface of said semiconductor ingot which has been cylindrically ground (104);

cutting off a second wafer sample (41) from a second cut side of said cylindrical body portion (31B) of said semiconductor ingot (105); and cutting off a third wafer sample (43) from said cylindrical body portion of said semiconductor ingot to divide said cylindrical body portion (31D) into a plurality of blocks (42, 44) (105).

2. A semiconductor ingot machining method for grinding and cutting grown but unprocessed semiconductor ingots (10), said cutting being executed after said grinding, said grinding being executed with one grinding device for each one of said semiconductor ingots, said grinding comprising the following sequential steps of:

selecting a semiconductor ingot;

mounting said unprocessed semiconductor ingot in said grinding device and cylindrically grinding said semiconductor ingot (S) while rotating said semiconductor ingot around an axis (91) to form a cylindrical body portion having a circumferential surface;

irradiating with x-rays said semiconductor ingot (30A, 30B) mounted in said grinding device while rotating said semiconductor ingot around the axis, detecting diffraction of said x-rays and determining an azimuth reference position based upon a peak detected value of said x-rays (93); and stopping rotation of said semiconductor ingot mounted in said grinding device and grinding said semiconductor ingot parallel to the axis at said azimuth reference position so as to form selectively an orientation flat (OF) and a notch;

for each one of said ground semiconductor ingots (30D), said cutting being executed with one inner diameter saw slicing machine, said cutting comprising the following sequential steps of:

cutting off a first of two cone-shaped ends (33b) of said semiconductor ingot by placing an inner diameter blade of said inner diameter saw slicing machine perpendicular to said circumference surface of said semiconductor ingot which has been cylindrically ground (101);

cutting off a first wafer sample (34) from a first cut side of said cylindrical body portion (31B) of said semiconductor ingot (102);

reversing an axis direction of said semiconductor ingot (103);

cutting off a second of the two cone-shaped end (32) of said semiconductor ingot by placing said inner diameter blade perpendicular to the circumferential surface of said semiconductor ingot which has been cylindrically ground (104);

cutting off a second wafer sample (41) from a second cut side of said cylindrical body portion (31B) of said semiconductor ingot (105); and cutting off a third wafer sample (43) from said cylindrical body portion of said semiconductor ingot to divide said cylindrical body portion (31D) into a plurality of blocks (42, 44) (105);

and further comprising the steps of; grinding cylindrically a circumference of one of said two cone-shaped ends of said semiconductor ingot mounted in said grinding device over a length from one end of said cylindrical body portion (33a) of said semiconductor ingot while rotating said semiconductor ingot around the axis (92), said cylindrical grinding (92) said circumference of one of said cone-shaped ends being implemented between said cylindrical grinding (91) said circumference of said cylindrical body portion and said azimuth reference position determining (93); and cutting off a portion (33c) including both different diameters of said semiconductor ingot as a fourth sample for measuring a lifetime (101), said cutting off (101) said fourth sample being implemented between said cutting off (101) said one of said cone-shaped ends and said cutting off (102) said first wafer sample.

* * * * *